United States Patent [19]

Schiffman

[11] 3,936,610

[45] Feb. 3, 1976

[54] DUAL DELAY LINE STORAGE SOUND SIGNAL PROCESSOR

[75] Inventor: Murray M. Schiffman, Westport, Conn.

[73] Assignees: Cambridge Research and Development Group, Westport, Conn.; Sanford D. Greenberg, Washington, D.C.; DT Liquidating Partnership, New York, N.Y.; Murray M. Schiffman, Westport, Conn.

[22] Filed: May 28, 1974

[21] Appl. No.: 473,437

Related U.S. Application Data

[63] Continuation of Ser. No. 224,035, Feb. 7, 1972, abandoned, which is a continuation-in-part of Ser. No. 171,571, Aug. 1, 1971, Pat. No. 3,786,195.

[52] U.S. Cl. .................. 179/15.55 T; 178/6.6 TC; 178/DIG. 3; 179/15.55 R
[51] Int. Cl.$^2$ ............................................ H04J 3/18
[58] Field of Search. 179/15.55 T, 15.55 R, 15 BW, 179/1.5 A; 178/6.6 TC, DIG. 3, 5.4 HE

[56] References Cited

UNITED STATES PATENTS

| 3,499,996 | 3/1970 | Klayman | 179/15.55 T |
| 3,621,150 | 11/1971 | Pappas | 179/15.55 T |
| 3,681,756 | 8/1972 | Burkhard | 179/1.5 A |

OTHER PUBLICATIONS

*IEEE Journal of Solid–State Circuits;* Vol. 564, No. 3, June 1969, "Bucket Brigade Electronics . . .," by Sangster et al., pp. 131–136.

*Nature;* Vol. 189, No. 4759, Jan. 14, 1961, pp. 117–119, "A Versatile Method for Short Term Spectrum Analysis . . .," by Gill.

*Primary Examiner*—Douglas W. Olms
*Attorney, Agent, or Firm*—Charles E. Pfund, Esq.

[57] ABSTRACT

Sound signals are processed for compression or expansion utilizing storage and frequency transformation into storage delay lines operated alternately to transform alternate segments of the sound signal respectively with the outputs of the two delay lines combined to produce a continuous sound signal output with the frequency components thereof transformed.

2 Claims, 4 Drawing Figures

DUAL DELAY LINE STORAGE SOUND SIGNAL PROCESSOR

This is a continuation of now abandoned application Ser. No. 224,035, filed Feb. 7, 1972, which itself is a continuation in part of U.S. Ser. No. 171,571, filed Aug. 1, 1971, now U.S. Pat. No. 3,786,195, issued Jan. 15, 1974.

BACKGROUND OF THE INVENTION

The background of the present invention is generally the same as that described in the herein referenced parent application of applicant. The field of the invention pertains to those species of applicant's invention in which analog signal storage and processing is achieved using two independent storage delay lines wherein the storage and processing of alternate segments of the incoming signal occurs respectively in the two delay storage lines with the outputs of the lines combined in alternation to produce a substantially continuous frequency converted output signal. Frequency conversion is affected by storage delay lines of the variable delay type or in the analog shift register version by employing separate and generally unequal read and write clock rates for loading and unloading the two analog shift registers in alternation. The use of this type of storage delay line for frequency conversion can also be incorporated in the various versions of applicant's invention disclosed in the parent application, such as the single delay line versions with or without lagging, gap filling, or speech signal substitution during the reset period for a single line system.

SUMMARY OF THE INVENTION

The present invention provides dual delay storage lines for alternating processing segments of a sound signal, such as speech, in order to provide a substantially continuous output signal when the speech has been compressed in time thereby substantially eliminating the gaps caused by the discarded portion of the speech signal. Delay storage for frequency conversion is accomplished either with delay lines having signal controlled variable length or delay which, as disclosed in applicant's parent application, can take various forms including the analog shift register version of delay storage. As disclosed herein, the analog shift register can also be employed with different read and write clock rates to accomplish delay signal storage that also provides frequency conversion of the signal passing therethrough. Any of the various disclosed versions of delay signal storage which accomplishes frequency conversion for a signal passing through the delay line or storage register can be employed in the dual line versions of the present invention or the various single line versions disclosed in the parent application.

It is, accordingly, the principal object of the present invention to provide improved sound signal processing for frequency conversion and time expansion or compression including unity or real time operation to provide substantially continuous signal output and with alternate and improved versions of delay signal storage to accomplish the frequency conversion of the sound signal.

DESCRIPTION OF THE PREFERRED EMBODIMENT

Figure 1:
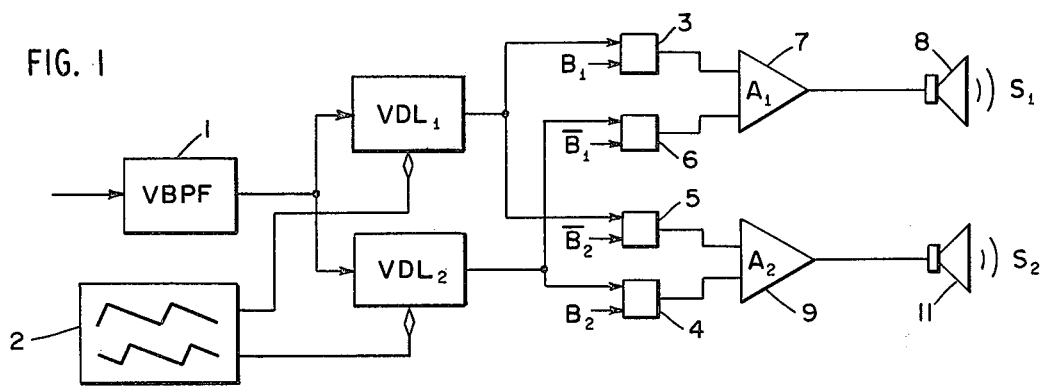
FIG. 1 is a block diagram of a generalized duel delay storage line sound signal processing system which has separate binaural output transducers.

FIG. 1 shows a dual line form of the invention as described in the parent application for binaural processing. The speech signal from the band pass filter 1 is applied to symmetrical variable delay lines VDL1 and VDL2 controlled by waveform generator 2. The output of VDL1 is applied as an input to gates 3 and 5. The output of VDL$_2$ is applied as an input to gates 4 and 6. The delay lines VDL$_1$ and VDL$_2$ are controlled for linear variation of delay with delay function having its rapid return transition at the mid-point of the linear delay portion of the other waveform. As described in applicant's co-pending application, the frequency conversion of the delay storage lines VDL$_1$ and VDL$_2$ can be accomplished with various devices. One such device is the analog shift register controlled either with a variable clock rate periodically varied between predetermined values or by using alternate and different write and read clock rates to periodically store the incoming signal and extract the frequency converted output signal, respectively.

Figure 2:
FIG. 2(a) and (b) show gating waveforms as applied to control the output signals of the system of FIG. 1.
Figure 2:

The gates 3 and 6 are controlled by gating waveforms $B_1$ and $\overline{B}_1$ shown in FIG. 2(a). Gate 3 passes signal during $\overline{B}_1$ and is blocked during $B_1$. Gate 6 is blocked during $\overline{B}_1$ and passes signal during $B_1$. Amplifier 7 combines the outputs of gates 3 and 6 and applies the combined signal to an audio reproducer 108.

The gates 4 and 5 are controlled by the gating waveforms $B_2$ and $\overline{B}_2$ shown in FIG. 2(b). Gate 4 passes signal during $\overline{B}_2$ and is blocked during $B_2$. Gate 5 is blocked during $\overline{B}_2$ and passes signal during $B_2$. Amplifier 9 combines the outputs of gates 4 and 5 and applies the combined signal to an audio reproducer 10.

The system of FIG. 1 operates to reproduce the entire original signal (for compression ratio equal to two) since each delay line processes the portion which is the discard for the other line. For compression ratios greater than two some message discard occurs and for ratios less than two the overlap or message duplication increases in the output. By listening binaurally, however, the intelligibility is enhanced since the overall discard is eliminated (or greatly reduced for the higher compression ratios) and the overlap or repeat of message portions is not detrimental to word detection by the listener.

A binaural system without supplemental gap filling (as distinguished from the system just described) would be achieved by removing gates 5 and 6 in FIG. 1. The lines VDL$_1$ and VDL$_2$ would supply the processed signal in alternation to the respective output transducers 108 and 110 for binaural output in a system otherwise generally similar to that shown in FIG. 9 of the herein referenced co-pending application.

Figure 3:
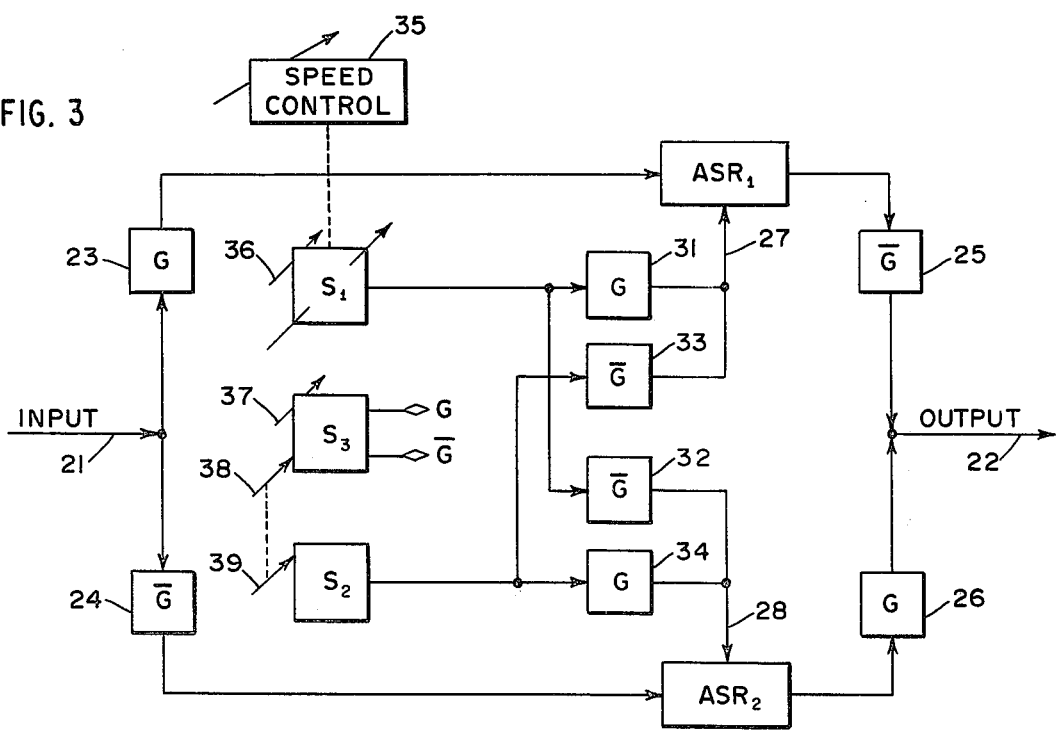
FIG. 3 is a block diagram of a duel delay storage line system employing analog shif registers with separate read and write clock pulse signals.

Referring now to FIG. 3 a dual delay line system employing analog shift registers having separate read and write clock rates will be described. As shown in FIG. 3 an input line 21 receives a sound input signal from any source such as a tape recorder driven at a speed different than the recording speed or some other signal source supplying a sound signal message which it is desired to convert as to frequency components and also change its time duration from zero to some longer or shorter time than the normal period during which the sound message was originated. The signal on line 21 is controlled for application to an analog shift register $ASR_1$ by passing through a gate G23 and is also controlled for application to an analog shift register $ASR_2$ by passing through a gate $\overline{G}$ 24. The outputs of the analog shift registers $ASR_1$ and $ASR_2$ are combined on an output line 22 by passing from the output of $ASR_1$ through a gate $\overline{G}$-25 and from the output of $ASR_2$ through a gate G-26.

The analog shift registers $ASR_1$ and $ASR_2$ are multistage registers adapted for passing the signal input thereto stage-by-stage to the output with the transfers occurring at clock rate determined by the clock pulse rate applied at clock terminals 27 and 28, respectively. The number of stages in the arrangement of the analog shift registers to transfer analog signal samples therethrough are all in accordance with the description given in applicant's co-pending application. In particular, a write pulse rate generator $S_1$ supplies an adjustable write pulse repetition rate through G-gate 31 to clock input 27 and through $\overline{G}$-gate 32 to clock input terminal 28. A read pulse rate generator $S_2$ supplies a relatively fixed read clock pulse rate through $\overline{G}$-gate 33 to terminal 27 and through G-gate 34 to terminal 28. The gates G and $\overline{G}$ are supplied by a gating pulse generator $S_3$ which may have an adjustable period and produces substantially symmetrical squarewave output for both the G and $\overline{G}$ gating functions.

The write pulse rate generated by the generator $S_1$ is variable as indicated and will generally be set in relation to a variable speed control device 35 which controls the rate at which the tape recording or other sound signal source reproduces the sound message signal at a time rate different than that of the original speech utterance. Thus, if the speech control 35 is set to play a tape recorder at twice the normal speed, the write clock pulse of generator $S_1$ can be set at twice the clock rate of generator $S_2$, thereby providing write-in at a clock rate which is twice the rate at which the information will be read-out as the generators $S_1$ and $S_2$ are alternately applied to control the shift registers. If desired, a feedback control can be applied at 36 to modify the clock rate of generator $S_1$ in accordance with an error signal to compensate for wow and flutter characteristics of a turntable or other periodic variation in the signal source which it is desired to eliminate.

The frequency of squarewave generator $S_3$ can be adjusted by control 37 and generally its period T will be given by the relation T equal $1/f_3$ equal to or less than the delay of the delay line $$\left( \frac{p-1}{p} \times \frac{N}{f_2} \right)$$

in the case of an analog shift register, where $p$ represents the number of transfer phases [normally and minimally two], and N is the total number of stages.

For this purpose the frequency control 37 of $S_3$ may be tied to the manual control for $S_1$ during the expansion mode of operation.

In addition, trimming controls 38 and 39 may be provided and interconnected for the generators $S_2$ and $S_3$ if desired.

Figure 4:
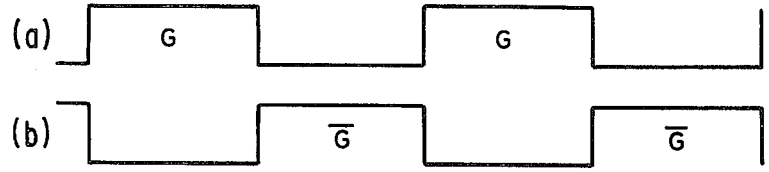
FIG. 4(a) and (b) show a waveform diagram of the gating control signals for the system of FIG. 3.

Operation of the system of FIG. 3 will now be described with reference to the waveforms of FIGS. 4(a) and (b). The general principles of operation set forth in applicant's parent application are applicable here and the compression ratio C that is obtained will be equal to the ratio $f_1/f_2$ where $f_1$ and $f_2$ are the frequencies of the squarewaves generated by generators $S_1$ and $S_2$, respectively. Obviously, for expansion, C is the fractional quantity and corresponds to the expansion factor $e$ mentioned in the parent application. Input signals arriving on line 21 are gated through gate 23 to load $ASR_1$ during the G-gate portion shown in FIG. 4(a) and the stages of $ASR_1$ are filled at a rate determined by the clock squarewave on line 27 which is derived from generator $S_1$ through G-gate 31. During this period there is no output from $ASR_1$ but to assure the absence of spurious or noise signals on the output, $\overline{G}$-gate 25 blocks signals from the output of $ASR_1$ to output line 22. During the G-gate the generator $S_2$ supplies clock pulses on line 28 to shift register $ASR_2$ and the G-gate 26 passes signals from the output of $ASR_2$ to output line 22.

When the squarewave generator $S_3$ changes state the $\overline{G}$-gates are conditioned to pass signal and the G-gates are conditioned to block signal passage. Thus, during the $\overline{G}$ intervals indicated in FIG. 4(b), signals on input line 21 are loaded through gate 24 into $ASR_2$ at the clock rate of generator $S_1$ applied through $\overline{G}$-gate 32 on line 28 and the signals stored in register $ASR_1$ are outputted through $\overline{G}$-gate 25 to output line 22 at the rate of generator $S_2$ applied through $\overline{G}$-gate 33 to line 27. Thus, on alternate half cycles of G and $\overline{G}$ depicted in FIG. 4 the input signal is alternately stored in $ASR_1$ and $ASR_2$ and while storage is taking place in one of the registers, the storage signal in the other register is outputted to the output line 22. The rates at which these take place are determined by the repetition rate of generators $S_1$ and $S_2$, respectively, and as previously described, for different frequencies of these generators either compression or expansion of the signal wave on line 21 can be obtained at the output line 22.

Thus, in accordance with the present invention a further form of signal storage delay for frequency transformation is provided using analog shift registers operated at different input and output clock rates. This arrangement permits processing of analog signals on line 21 including complex speech waves and the like without the necessity for digitizing the input signal or otherwise conditioning it for the delay and frequency transformation processing. A further advantage of operating the analog shaft registers at different input and output clock rates as opposed to operating them as variable delay lines, is the elimination of the need for an inverse frequency control function generator such as the Unit 115 disclosed in FIG. 17 of the referenced co-pending application of applicant. In the present application of the analog shift register shown in FIG. 3, the clock rates are fixed but different for the input and output control to the analog shift registers and the ratio of the clock rates directly determines the compression ratio (or expansion ratio) which is applied to the signal which passes therethrough.

Modifications of the present invention will be apparent in light of the present disclosure, especially when taken into view of applicant's parent application. In particular, the two frequency write and read control of an analog shift register can be applied to a single storage delay line system such as that shown in FIG. 7 of applicant's parent application. Other modifications can also be made without departing from the scope of the invention as defined by the appended claims.

I claim:

1. A processor for analog electric signals representing coded audible signals such as speech or the like, said electric signals being analog representations of said audible signals with the frequency components of said electric signals related by a given factor to the frequency components of said audible signals comprising:

two similar analog shift register delay lines having input terminals coupled to a source of said analog electric signals for serially entering sequential analog samples of said analog electric signals at said input terminals thereof and having output terminals for serially removing said analog samples from said delay lines at said output terminals;

said input terminals coupled to said source of analog signals through input switch means operable to supply said analog signals alternately to said input terminals; and said output terminals coupled through output switch means operable alternately to pass said analog samples emerging from said delay lines;

first and second predetermined frequency clock sources for clocking said delay lines;

means for controlling said delay lines alternately from said clock frequency sources for simultaneous alternate serial entry and removal of said analog samples at said first and second clock frequencies, respectively, to produce predetermined frequency transformation for signals made up of the sequence of said analog samples emerging at said output terminals of said delay lines, said means for controlling said delay lines also controlling said input and output switches to input one said line while outputting the other said line and vice-versa; and analog signal processing means coupled to said output terminals of both said delay lines through said output switch means and responsive to said analog samples emerging alternately from said delay lines which have been subject to said predetermined frequency transformation for producing an output analog signal reproducible as an audible representation of said electric signals having frequency components altered by substantially the inverse of said factor to approximate the frequency components of said audible signals.

2. An analog speech compressor-expander for a recording reproduced at play-back speed greater or less than the recorded speed thereby producing a time and frequency altered signal comprising:

two analog shift registers having input terminals, output terminals and clocking terminals;

an input double throw switch means operable for alternately supplying said signal to said input terminals;

an output double throw switch means operable for alternately supplying the signals from said output terminals to a common output line;

a source of two clocking frequencies;

double-pole double-throw switch means operable for alternately applying said two clocking frequencies to said clocking terminals; and control means for operating all of said switch means in unison to input one said line at one clock frequency while outputting the other said line at the other clock frequency and vice-versa, said two clocking frequencies having a ratio corresponding to the ratio of said recorded and playback speed to produce on said output line only a time altered but frequency restored signal replica of said recording.

* * * * *